United States Patent
Zhao et al.

(10) Patent No.: US 9,013,016 B2
(45) Date of Patent: Apr. 21, 2015

(54) MR DEVICE WITH SYNTHETIC FREE LAYER STRUCTURE

(71) Applicant: Headway Technologies, Inc., Milpitas, CA (US)

(72) Inventors: Tong Zhao, Fremont, CA (US); Hui-Chaun Wang, Pleasanton, CA (US); Yu-Chen Zhou, San Jose, CA (US); Min Li, Dublin, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/166,373

(22) Filed: Jan. 28, 2014

(65) Prior Publication Data

US 2014/0138783 A1 May 22, 2014

Related U.S. Application Data

(62) Division of application No. 12/313,351, filed on Nov. 19, 2008, now Pat. No. 8,653,615.

(51) Int. Cl.
| | |
|---|---|
| *H01L 29/82* | (2006.01) |
| *H01L 43/08* | (2006.01) |
| *B82Y 25/00* | (2011.01) |
| *B82Y 40/00* | (2011.01) |
| *G01R 33/09* | (2006.01) |
| *G11B 5/39* | (2006.01) |
| *G11C 11/16* | (2006.01) |
| *H01F 10/32* | (2006.01) |
| *H01F 41/30* | (2006.01) |
| *H01L 43/12* | (2006.01) |

(52) U.S. Cl.
CPC ................ *H01L 43/08* (2013.01); *B82Y 25/00* (2013.01); *B82Y 40/00* (2013.01); *G01R 33/098* (2013.01); *G11B 5/3906* (2013.01); *G11C 11/16* (2013.01); *H01F 10/3254* (2013.01); *H01F 10/3272* (2013.01); *H01F 41/302* (2013.01); *H01L 43/12* (2013.01)

(58) Field of Classification Search
USPC .................. 257/427, 421; 365/158, 171, 173
See application file for complete search history.

(56) References Cited

U.S. PATENT DOCUMENTS

| | | | |
|---|---|---|---|
| 6,841,395 | B2 | 1/2005 | Linn et al. |
| 7,130,166 | B2 | 10/2006 | Gill |
| 7,141,314 | B2 | 11/2006 | Zhang et al. |

(Continued)

OTHER PUBLICATIONS

Japanese Office Action Japanese Patent App No. 2009-263033 mailed: Feb. 26, 2014, Headway Technologies Inc.

(Continued)

*Primary Examiner* — Samuel Gebremariam
(74) *Attorney, Agent, or Firm* — Saile Ackerman LLC; Stephen B. Ackerman

(57) ABSTRACT

A magneto-resistive device having a large output signal as well as a high signal-to-noise ratio is described along with a process for forming it. This improved performance was accomplished by expanding the free layer into a multilayer laminate comprising at least three ferromagnetic layers separated from one another by antiparallel coupling layers. The ferromagnetic layer closest to the transition layer must include CoFeB while the furthermost layer is required to have low Hc as well as a low and negative lambda value. One possibility for the central ferromagnetic layer is NiFe but this is not mandatory.

9 Claims, 1 Drawing Sheet

(56) References Cited

U.S. PATENT DOCUMENTS

| | | | |
|---|---|---|---|
| 7,149,105 | B2 | 12/2006 | Brown et al. |
| 7,888,755 | B2 * | 2/2011 | Hosomi et al. ............ 257/421 |
| 2006/0267058 | A1 | 11/2006 | Takenaga et al. |
| 2006/0291108 | A1 | 12/2006 | Sbiaa et al. |
| 2007/0097561 | A1 | 5/2007 | Miyauchi et al. |
| 2007/0111332 | A1 | 5/2007 | Zhao et al. |
| 2008/0117553 | A1 | 5/2008 | Carey et al. |
| 2009/0121710 | A1 | 5/2009 | Wang et al. |
| 2009/0122450 | A1 | 5/2009 | Wang et al. |

OTHER PUBLICATIONS

"Ultralow resistance-area product of 0.4 ohm(um)sq. and high magnetoresistance above 50% in CoFeB/MgO/CoFeB magnetic tunnel junctions," by Yoshinori Nagamine et al., Applied Physics Letters 89, 162507 (Oct. 2006), pp. 162507-1 to 162507-3.

"Giant tunneling magnetoresistance effect in low-resistance CoFeB/MgO (001)/CoFeB magnetic tunnel junctions for read-head applications," by Koji Tsunekawa et al., Applied Physics Letters 87, 072503 (Aug. 2005), pp. 072503-1 to 072503-3.

"230% room-temperature magnetoresistance in CoFeB/MgO/CoFeB magnetic tunnel junctions," by David D. Djayaprawira et al., Applied Physics Letters 86, 092502 (Feb. 2005), pp. 092502-1 to 092502-3.

"Giant tunneling magnetoresistance up to 410% at room temperature in fully epitaxial Co/MgO/Co magnetic tunnel junctions with bcc Co(001) electrodes," Applied Physics Letters 89, 042505 (Jul. 2006), pp. 042505-1 to 042505-3.

"Giant tunnelling magnetoresistance at room temperature with MgO(100) tunnel bariers," by Stuart S. P. Parkin et al., 2004 Nature Publishing Group, nature materials/vol. 3/Dec. 2004/www.natur.com/naturematerials, pp. 862-867.

"Giant room-temperature magnetoresistance in single-crystal Fe/MgO/Fe magnetic tunnel junctions," by Shinji Yuasa et al., 2004 Nature Publishing Group, nature materials/vol. 3/Dec. 2004/www.nature.com/naturematerials, pp. 868-871.

* cited by examiner

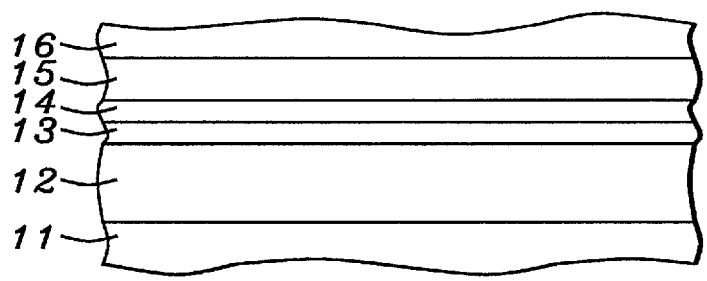
FIG. 1 - Prior Art
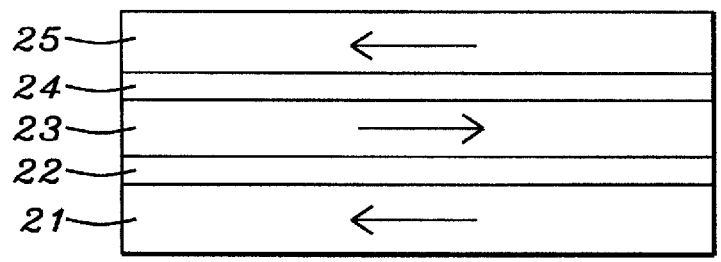
FIG. 2
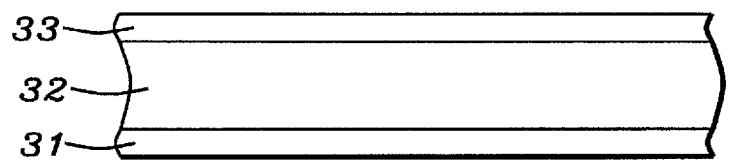
FIG. 3

MR DEVICE WITH SYNTHETIC FREE LAYER STRUCTURE

This is a Divisional Application of U.S. patent application Ser. No. 12/313,351, filed on Nov. 19, 2008, which is herein incorporated by reference in its entirety, and assigned to a common assignee.

FIELD OF THE INVENTION

The invention relates to the general field of magneto resistance (MR) with particular reference to the micro-structure of the free layer.

BACKGROUND OF THE INVENTION

Magnetic tunneling junction (MTJ) is a key component of both magnetic recording heads and magnetic random access memory (MRAM). A typical MTJ structure for a recording head or for an MRAM application is schematically illustrated in FIG. 1, as follows:

Buffer layer 11, antiferromagnetic layer (AFM) 12, an outer pinned layer, Ru, (neither shown) inner pinned layer 13 (the reference layer), tunnel barrier layer 14, free layer 15, and capping layer 16. In this structure, free layer 15 serves as the sensing layer which responds to external fields (specifically those stored in the media) while inner pinned layer 13 remains fixed and serves as reference layer. The electrical resistance through barrier (i.e. insulating) layer 14 varies with the relative orientation of the free layer moment relative to the reference layer moment thereby converting magnetic information stored in the media into electrical signals.

For effective operation as part of a magnetic recoding head, the basic requirements for TMR sensors are as following:
1) Low resistance·area product (RA)
2) High magneto resistance (MR) ratio
3) A soft free layer having low magnetostriction
4) Low interlayer coupling through the barrier layer.
5) Strongly pinned reference layer.

MgO-based MTJs are promising candidates for achieving high recording density and/or high frequency application because their TMR ratio is significantly higher than those of AlOx or TiOx based MTJs. S. Yuasa et al [1] and S. S. Parkin et al. [2] demonstrated that MR ratios around 200% can be achieved at room temperature in epitaxial Fe(001)/MgO (001)/Fe(001) and with polycrystalline FeCo/MgO/ $(Fe_{70}Co_{30})_{80}B_{20}$ MTJs.

Yuasa et al. [3] have also reported that TMR ratios as high as 410% at room temperature can be achieved in fully epitaxial Fe(001)/Co(001)/MgO(001)/Co structures. Meanwhile, D. D. Djayaprawira et al [4] showed that MTJs of CoFeB/MgO(001)/CoFeB structure made by conventional sputtering can also have a very high MR ratio (230%) with the added advantage of greater feasibility and uniformity. For low RA applications, the MR ratio of CoFeB/Mg/MgO/CoFeB MTJs can reach 138% at RA=2.4 ohm·μm$^2$ was achieved by K. Tsunekawa et al [5] by inserting a DC-sputtered metallic Mg layer in between the bottom CoFeB and the rf-sputtered MgO, an idea initially proposed by T. Linn et al. [6] to prevent oxidation of the bottom electrode (CoFe) in a CoFe/MgO/ reactive sputtering/NiFe structure. Also, Ta getter-presputtering prior to the rf-sputtered MgO layer can achieve 55% TMR with an RA of 0.4 ohm·micron$^2$ as recently reported by Y. Nagamine et al. [7]. An alternative way to form a low RA MgO barrier is to deposit two metallic Mg layers with a natural oxidation process in between as we previously proposed for the benefit of better process control and MRR uniformity.

CoFeB material has been used in MgO based MTJs to achieve a magnetically soft free layer having a high MR ratio. High MR ratio and low RA has been demonstrated in MgO MTJs with CoFeB free layer. It was also demonstrated that insertion of a thin CoFe layer between MgO barrier and CoFeB facilitates getting a high MR ratio even at low annealing temperatures (ca. 300° C.). However, there remains a concern that a CoFeB free layer will have a high positive magnetostriction coefficient (lambda).

There are several possible ways to reduce lambda in a CoFeB based free layer. As shown elsewhere, lambda can be reduced by replacing CoFeB with CoB or by adjusting the CoFeB composition. However, magnetic softness deteriorated at the high annealing temperature needed to achieve a high MR ratio. To tackle this issue, a special annealing procedure was developed whereby a relatively high dR/R could be achieved while the free layer was still soft. An alternative approach for reducing lambda is to add a NiFe layer, which has negative lambda and is magnetically soft, on top of the CoFeB in the free layer. However, CoFeB/NiFe-type free layer structure is not usable because direct contact between CoFeB and NiFe causes a drastic drop in MR ratio.

H. Wang et al have proposed to use CoFe/CoFeB/Ta/NiFe as a free layer with high dR/R. In this structure, high dR/R can be achieved because the CoFeB is separated from the NiFe by a Ta insertion layer. The CoFe\CoFeB and NiFe layers are magnetically coupled through orange-peel type coupling, which tend to align magnetic moments to be parallel. However, this coupling is relatively weak and, in the case of real devices, has to compete with magnetostatic coupling from the edge of two layers which tend to align these two layers anti-parallel. As a result, magnetic noise for this kind of structure is relatively high. So although signal amplitude is high, improvement in signal-to-noise ratio is limited.

REFERENCES

1. S. Yuasa et al "Giant room-temperature magnetoresistance in single-crystal Fe/MgO/Fe magnetic tunnel junctions", *Nature Materials* 3, 868-871 (2004).
2. S. S. P. Parkin et al, "Giant tunnelling magnetoresistance at room temperature with MgO (100) tunnel barriers", Nature Materials 3, 862-867 (2004).
3. S. Yuasa et al. "Giant tunneling magnetoresistance up to 410% at room temperature in fully epitaxial Co/MgO/Co magnetic tunnel junctions with bcc Co(001) electrodes", Applied Physics Letters 89, 042505 (2006).
4. D. D. Djayaprawira et al. "230% room-temperature magnetoresistance in CoFeB/MgO/CoFeB magnetic junctions", Applied Physics Letters 86, 092502 (2005).
5. K. Tsunekawa et al. "Giant tunneling magnetoresistance effect in low-resistance CoFeB/MgO(001)/CoFeB magnetic tunnel junctions for read-head applications" Applied Physics Letters 87, 072503 (2005).
6. T. Linn et al., "Method of forming a barrier layer of a tunneling magnetoresistvie sensor", U.S. Pat. No. 6,841, 395.
7. Y. Nagamine et al. "Ultralow resistance-area product of 0.4 ohm**μm0̂2 and high magnetoresistance above 50% in CoFeB/MgO/CoFeB magnetic junctions" Applied Physics Letter 89 162507 (2006).
8. T. Zhao et al. Headway Invention Proposal HT05-045— "Low Resistance Tunneling Magnetoresistive Sensor With Natural-Oxidized Double MgO Barrier"

9. H. Wang et al Headway Invention Proposal HT07-040 "TMR Sensor with Low magnetostriction Free layer
10. H. Wang et al Headway Invention Proposal HT07-028 "Novel Free Layer Design for TMR/CPP Device".

A routine search of the prior art was performed with the following references of interest being found:

In U.S. Patent Application 2008/0117553, Carey et al. disclose a free layer comprising CoFe/spacer/NiFe/spacer/CoFe where the spacer is Cu, Au, or Ag and where a third element can be alloyed with the CoFe or NiFe. Additional discussion of this reference appears later in connection with TABLE I.

In U.S. Pat. No. 7,130,166, Gill shows a three-layer free layer where the first and third layers are CoFe/NiFe and the second layer is NiFe, but any of these layers can be NiFe, CoFe, or an CoFe/NiFe stack. The layers are separated by Ru. U.S. Pat. No. 7,141,314 (Zhang et al—Headway) teaches free layer laminates of CoFe and FeCo with spacer layers of Cu. In U.S. Pat. No. 7,149,105, Brown et al. disclose a free layer comprising NiFe and CoFeB separated by a nonmagnetic spacer such as Ru, having a thickness of 2-30 Angstroms.

U.S. Patent Application 2007/0097561 (Miyauchi et al.) shows a free layer comprising alloys of Co, Fe, Ni having a nonmagnetic layer in between while in U.S. Patent Application 2006/0291108, Sbiaa et al. describe a free layer containing a nonmagnetic spacer such as Ru, Rh, Ag, Cu.

SUMMARY OF THE INVENTION

It has been an object of at least one embodiment of the present invention to provide a magneto-resistive device having a large output signal as well as a high signal-to-noise ratio.

Another object of at least one embodiment of the present invention has been that said device be any of CIP-GMR, CPP-GMR, MTJ, and TMR devices.

Still another object of at least one embodiment of the present invention has been to provide a process for forming said magneto-resistive device.

A further object of at least one embodiment of the present invention has been for said process be fully compatible with existing processes for forming magneto-resistive devices.

These objects have been achieved by expanding the free layer into a multilayer laminate comprising at least three ferromagnetic layers separated from one another by antiparallel coupling layers, whereby the central ferromagnetic layer has a magnetization direction that is antiparallel to that of the two outer layers.

Additionally, the first of these three ferromagnetic layers, the one closest to the transition layer, must include (or consist entirely of) CoFeB while the third layer is required to have low Hc as well as a low and negative lambda value. One possibility for the central ferromagnetic layer is NiFe but this is not mandatory.

Processes for forming both the expanded free layer as well as the full device are also described.

BRIEF DESCRIPTION OF THE DRAWINGS

FIG. 1 is a schematic cross-section of a TMR stack of the prior art, including simple free layer 15.

FIG. 2 shows how free layer 15 of the prior art has been expanded into a laminate of three antiparallel coupled ferromagnetic layers.

FIG. 3 shows how the first of the ferromagnetic layers of FIG. 2 has been further expanded into a three layer laminate.

DESCRIPTION OF THE PREFERRED EMBODIMENTS

The present invention discloses a free layer structure comprising at least three magnetic layers whose magnetic moments are antiparallel coupled through Ru layers. This is illustrated in FIG. 2 which shows how the simple free layer 15 seen in FIG. 1 has been expanded to become a more complex structure. Seen in FIG. 2 are ferromagnetic layers mag1, mag2, and mag3 which have been designated as layers 21, 23, and 25 respectively. The magnetizations of layers 21 and 23 are antiparallel to each other as are those of layers 25 and 23, the required antiparallel coupling between the two pairs of layers being provided by Ru layers 22 and 24, respectively. Note that, while Ru is generally preferred, acceptable antiparallel coupling can also be achieved by using other materials such as Rh, Cu, Cr, or Ir in place of Ru. As with Ru, their thickness should be in a range of from 4-10 Å.

Mag1 can be made of single layer or combination of: CoxFe1−x (x=0~100%), (CoxFe1−x)1−yBy (x=0~100%, y=10~40%) or their alloys with third or forth elements, such as Ni, Ta, Mn, Ti, W, Zr, Hf, Tb. For example, CoFeB, CoFe\CoFeB or CoFe\CoFeB\CoFe. The thickness for each layer may be 1~40 A. Materials or structures that give higher dR/R are preferred.

Mag2 can be a single layer or a combination of: NixFe1−x (x=0~100) CoxFe1−x (x=0~100%) and their alloys with third or fourth elements, such as Ni, Ta, Mn, Ti, W, Zr, Hf, Tb or B. For example, CoFe, NiFe or CoFe\NiFe\CoFe. The thickness for each layer may be 1~30 A. Materials or structures with low or negative lambda that promote strong coupling through spacers are preferred.

Mag3 can be a single layer or combination of: NixFe1−x (x=0~100) CoxFe1−x (x=0~100%), their alloys with third or fourth elements, such as Ni, Ta, Mn, Ti, W, Zr, Hf, Tb or B. For example, NiFe, CoFe\NiFe or CoFe\NiFe\CoFe. The thickness for each layer may be 1~80 A. Materials or structures with negative lambda and low Hc are preferred.

The TMR barrier can be MgO, MgZnO, ZnO, $Al_2O_3$, TiOx, AlTiO, HfOx, ZrOx or any combination of these.

As illustrated in FIG. 3, Mag1 may be sandwiched between two layers, 31 and 33, of CoFe, each about 3 Å thick. Layer 31 enhances the MR ratio for anneal temperatures less than about 300° C. while layer 33 is for strong AP coupling through layer 22.

The characteristics required for the five main layers are summarized in TABLE I below. For comparison purposes we have also included the main features of the structures disclosed in U.S. 2008/011753, mentioned earlier in connection with our prior art search:

TABLE I

|  | 2008/0117553 | PRESENT INVENTION | COMMENTS |
|---|---|---|---|
| MAG1 | CoFe(40-60%), CoFeAl or CoFeSi | CoFeB, CoFe/CoFeB or CoFe/CoFeB/CoFe, or alloy with $4^{th}$ element | Must include CoFeB |
| MAG2 | NiFe (2-25%) | CoFe, NiFe, or CoFe/NiFe/CoFe | Not limited to NiFe |
| MAG3 | CoFe(40-60%), CoFeAl or CoFeSi | NiFe, CoFe/NiFe or CoFe/NiFe/CoFe | Low Hc and negative lambda required* |
| APC LAYERS | Cu, Au, Ag; 1-5 Å | Ru, Rh, Cu, Cr, Ir; 4-10 Å | Must promote APC, ruling out Au & Ag |

*Cannot be accomplished by CoFe (40-60%) single layer

In TABLE II below, we show data for a number of different TMR stacks having different free layer structures. Samples A and B, with free layers of CoFe3\CoFeB\Ru and CoFe3\CoFeB\CoFe\Ru respectively, have high MR ratios (up to 67% at RA 1.5) but cannot be used because of their very high positive lambda values (~1.4E-5).

Inserting Ru\NiFex\Ru\NiFey on top allows us to significantly reduce magnetostriction while still maintaining a high MR ratio and good magnetic softness (see samples C, D, E, and F). The amount of magnetostriction and the magnetic moment can be readily tuned by adjusting the thickness of the two NiFe layers. Sample F has near zero magnetostriction, a Bs slightly higher than the reference (sample B), and an Hc of only 5.6 Oe.

In samples D and F, a thin CoFe layer has been inserted for the purpose of enhancing the coupling strength between CoFeB and NiFe layers. For example, the coupling field for CoFe3\CoFeB20\Ru8\NiFe35 is 800 Oe and which increases to 1700 Oe for CoFe3\CoFeB20\CoFe3\Ru8\NiFe35. Coupling strength could be even further improved by inserting another thin CoFe layer under the NiFe or by replacing NiFe with CoFe, Sample G is an example of a synthetic free layer with thicker top NiFe layer and a thinner middle NiFe layer, demonstrating that Bs can be adjusted independently of total thickness and lambda.

TABLE II

| Sample ID | Free Layer Structure | Bs (nW) | Hc (Oe) | Lambda |
|---|---|---|---|---|
| A | CF3\CFB20\Ru | 0.34 | 4.9 | 1.4E-05 |
| B | CF3\CFB20\CF3\Ru | 0.37 | 4.5 | 1.4E-05 |
| C | CF3\CFB20\Ru\NF15\Ru\NF20 | 0.40 | 5.3 | 3.8E-06 |
| D | CF3\CFB20\CF3\Ru\NF15\Ru\NF20 | 0.44 | 5.2 | 3.9E-06 |
| E | CF3\CFB20\Ru\NF35\Ru\NF40 | 0.41 | 5.8 | -2.3E-07 |
| F | CF3\CFB20\CF3\Ru\NF35\Ru\NF40 | 0.44 | 5.6 | 2.0E-08 |
| G | CF3\CFB20\CF3\Ru\NF20\Ru\NF20 | 0.59 | 4.2 | -4.2E-07 |

MgO MTJ with CoFe\CoFeB and CoFe\CoFeB free layers.

The structure of the full TMR stack was Ta\Ru\IrMn\CoFe\Ru\CoFe\MgO\FL\capping. The films were annealed at 280° C. for 5 hours in a magnetic field of 8K Oe.

Note that the free layer of the present invention may also be used in other similar MR structures (such as CIP-GMR, CPP-GMR and TMR), particularly those that need high lambda material to boost dR/R, while still retaining low free layer softness.

What is claimed is:

1. A magneto-resistive device, comprising:
   an antiferromagnetic layer on a substrate:
   a magnetically pinned reference layer on said antiferromagnetic layer;
   a transition layer on said magnetically pinned reference layer;
   a first layer of ferromagnetic material (MAG1) on said transition layer;
   on MAG1, a first antiparallel coupling layer;
   on said first antiparallel coupling layer, a second layer of ferromagnetic material (MAG2);
   on MAG2, a second antiparallel coupling layer;
   on said second antiparallel coupling layer, a third layer of ferromagnetic material (MAG3) having a coercivity less than about 5 Oe and a negative lambda value that is less than about $2 \times 10^{-6}$;
   a capping layer on MAG3; and
   said three ferromagnetic layers being magnetized in a manner such that MAG1 and MAG3 are magnetized parallel to one another and antiparallel to MAG2.

2. The magneto-resistive device described in claim 1 wherein said transition layer is copper whereby said magneto-resistive device is selected from the group consisting of current in plane-giant magneto-resistive (CIP-GMR) and current perpendicular to plane giant magneto-resistive (CPP GMR) devices.

3. The magneto-resistive device described in claim 2 wherein said first and second antiparallel coupling layers are selected from the group consisting of Ru, Rh, Cu, Cr, and Ir.

4. The magneto-resistive device described in claim 2 wherein MAG1 further comprises:
   a first layer of CoFe having a thickness in the range of from 2 to 10 Å;
   on said first layer of CoFe, a layer of CoFeB having a thickness in the range of from 10 to 40 Å; and
   on said layer of CoFeB a second layer of CoFe having a thickness in the range of from 2 to 10 Å.

5. The magneto-resistive device described in claim 2 wherein MAG2 and MAG3 are each selected from the group consisting of CoFe, NiFe, and a CoFe/NiFe/CoFe laminate.

6. The magneto-resistive device described in claim 1 wherein said transition layer is a tunneling barrier layer selected from the group consisting of MgO, MgZnO, ZnO, $Al_2O_3$, TiOx, AlTiO, HfOx, ZrOx, including any combination of these group members, whereby said magneto-resistive device is selected from the group consisting of magnetic tunneling junction (MTJ) and tunneling magneto-resistive (TMR) devices.

7. The magneto-resistive device described in claim 6 wherein said first and second antiparallel coupling layers are selected from the group consisting of Ru, Rh, Cu, Cr, and Ir.

8. The magneto-resistive device described in claim 6 wherein MAG1 further comprises:
   a first layer of CoFe having a thickness in the range of from 2 to 10 Å;
   on said first layer of CoFe, a layer of CoFeB having a thickness in the range of from 10 to 40 Å; and
   on said layer of CoFeB a second layer of CoFe having a thickness in the range of from 2 to 10 Å.

9. The magneto-resistive device described in claim 6 wherein MAG2 and MAG3 are each selected from the group consisting of CoFe, NiFe, and a CoFe/NiFe/CoFe laminate.

* * * * *

UNITED STATES PATENT AND TRADEMARK OFFICE
CERTIFICATE OF CORRECTION

| | | |
|---|---|---|
| PATENT NO. | : 9,013,016 B2 | Page 1 of 1 |
| APPLICATION NO. | : 14/166373 | |
| DATED | : April 21, 2015 | |
| INVENTOR(S) | : Tong Zhao et al. | |

It is certified that error appears in the above-identified patent and that said Letters Patent is hereby corrected as shown below:

On the Title Page

In the Inventors (72), delete second Inventor "Hui-Chaun Wang" and replace with
-- Hui-Chuan Wang --.

Signed and Sealed this
Twenty-ninth Day of September, 2015

Michelle K. Lee
*Director of the United States Patent and Trademark Office*